United States Patent

Takahashi et al.

[11] Patent Number: 6,161,676
[45] Date of Patent: Dec. 19, 2000

[54] COMPONENT FEEDER

[75] Inventors: Shigeki Takahashi; Nihei Kaishita; Akira Nemoto, all of Omihachiman, Japan

[73] Assignee: Murata Manufacturing Co., Ltd., Nagaokakyo, Japan

[21] Appl. No.: 09/345,960

[22] Filed: Jul. 1, 1999

[30] Foreign Application Priority Data

Jul. 6, 1998 [JP] Japan .................................. 10-189549
Aug. 27, 1998 [JP] Japan .................................. 10-241410

[51] Int. Cl.[7] .......................... B65G 47/14; B65G 47/24
[52] U.S. Cl. ........................ 198/396; 198/382; 198/392; 198/397.05; 198/397.03; 221/168; 221/167; 221/171
[58] Field of Search .................................... 198/396, 638, 198/642, 397.03, 397.05, 392; 209/683, 680; 221/188, 189, 157, 163, 171, 172, 167, 168

[56] References Cited

U.S. PATENT DOCUMENTS

| | | | |
|---|---|---|---|
| 3,948,386 | 4/1976 | Nalbach | 198/287 |
| 4,141,461 | 2/1979 | LaChance | 220/253 |
| 4,306,647 | 12/1981 | Boucherie | 198/379 |
| 4,537,300 | 8/1985 | Facchini | 198/453 |
| 4,896,616 | 1/1990 | Wintersteiger et al. | 111/185 |
| 4,928,808 | 5/1990 | Marti | 198/397 |
| 5,060,782 | 10/1991 | Marti | 198/392 |
| 5,065,852 | 11/1991 | Marti | 198/392 |
| 5,549,189 | 8/1996 | Martisala | 198/380 |
| 5,826,696 | 10/1998 | Rupp et al. | 198/392 |
| 5,845,810 | 12/1998 | Laznicka | 221/172 |
| 5,927,467 | 7/1999 | Spatafora | 198/392 |
| 5,934,505 | 8/1999 | Shimada | 221/236 |
| 6,019,212 | 2/2000 | Takahashi et al. | 198/392 |

FOREIGN PATENT DOCUMENTS

| | | |
|---|---|---|
| 0 885 820 | 12/1998 | European Pat. Off. . |
| 9-180348 | 7/1997 | Japan . |
| 2327080 | 1/1999 | United Kingdom . |

Primary Examiner—H. Grant Skaggs
Assistant Examiner—Jeffrey A. Shapiro
Attorney, Agent, or Firm—Burns, Doane, Swecker & Mathis, LLP

[57] ABSTRACT

A component feeder is provided in which damage to chip components is minimized, being capable of efficiently discharging chip components aligned in a line. A bulk case is attached on the top portion of an outer storage housing capable of being supplied by a large number of chip components. Chip components are supplied from the outer storage housing to an inner housing of a component-storage housing via a supplying path. A predetermined number of the chip components in the inner housing is fed at a time to the outer housing via a communicating path in accordance with rotation of a rotary drum so as to be dropped into an aligning groove and aligned by a lug member of the rotary drum. The number of components in the outer housing is reduced, resulting in high efficiency of aligning and reduced damage to components. The chip components slide down on the aligning groove to be discharged to a discharge path, via the gate, aligned in a line.

9 Claims, 6 Drawing Sheets

COMPONENT FEEDER

BACKGROUND OF THE INVENTION

1. Field of the Invention

The present invention relates to a component for feeder for feeding a large number of chip components aligned in a line.

2. Description of the Related Art

As conventional component feeders, bulk feeders and vibrating bowl feeders are known. The bulk feeder may be roughly classified into the disentanglement by air type and the disentanglement by a thrust-up pin type. In the air type, there is a problem of difficulty in adjusting the amount and the direction of air, while in the thrust-up pin type, there is a problem in that components are prone to be damaged as the pin strikes components at every stroke. Since chip components are simultaneously centered toward a funnel-shaped outlet in either of these types, even if an entanglement is broken once, another entanglement will form, resulting in decreased feeding efficiency. In contrast, in the vibrating bowl feeder, although entanglements are difficult to form, there are problems in the expensiveness of the apparatus, transmission of vibrations to other apparatuses, and the large space required for installation.

In order to solve these problems, the applicant proposed a component feeder having a simple structure and high efficiency in aligning and discharging components (Japanese Patent Application No. 9-180348 which has not been published yet). This component feeder comprises a component storage housing for accommodating chip components disposed between a fixed drum and a rotary drum, an aligning groove disposed on the inner surface of the fixed drum to slide the chip components downward aligned in a predetermined direction, a gate disposed in the bottom end of the aligning groove to pass chip components individually to slid down along the aligning groove in a predetermined orientation therethrough, and a discharge path for discharging the chip component passed through the gate in an aligned state. On the inner surface of the rotary drum, lug members are provided for urging a component in an abnormal orientation stopping at the gate toward the direction opposite to discharge to undo the blockage.

In this component feeder, chip components are dropped into the aligning groove so as to be aligned in a predetermined direction, then are passed through the gate so as to be aligned in a predetermined orientation, and moreover blocking is undone by the lug members of the rotary drum, resulting in high efficiency in aligning and discharging components. However, since chip components are directly supplied to the component storage housing structurally, in consideration of efficiency in aligning and discharging of chip components, it is not preferable to supply a large number of chip components. When a large number of chip components is supplied in an enlarged component storage housing, extended agitation time of chip components produces a risk of damage to components.

SUMMARY OF THE INVENTION

Accordingly, it is an object of the present invention to provide a component feeder with a small risk of damage to chip components and which has high efficiency in supplying components by aligning them in one line.

In accordance with the present invention, a component feeder is provided which comprises a feeder body; a rotary drum rotating relative to the feeder body about a horizontal axis; and a component storage housing formed between the feeder body and the rotary drum for storing chip components; wherein the rotary drum is provided with a circumferential wall dividing the component storage housing into an inner housing and an outer housing, the circumferential wall being provided with a communicating path for transferring a predetermined number of chip components at a time from the inner housing to the outer housing in accordance with the rotation of the rotary drum, the outer housing being provided with an aligning and discharging section for aligning chip components in a line so as to be discharged.

The chip components supplied to the inner housing of the component storage housing are transferred to the outer housing via the communicating path in accordance with the rotation of the rotary drum. The number of the chip components entering in the outer housing is limited by the size of the communicating path, the rotational speed of the rotary drum, and so forth. Therefore, the number of components in the outer housing is to be comparatively small, resulting in reduction of entanglement and increasing aligning and discharging efficiency of the aligning and discharging section. Simultaneously, since agitating time of chip components is reduced when the chip components are discharged in aligned positions from the aligning and discharging section, damage to components can be reduced.

The communicating path may be inclined toward the inner diameter of the rotary drum relative to the rotational direction of the rotary drum. In this case, the chip components in the inner housing can be scooped up thereby corresponding to the rotation of the rotary drum to be dropped into the outer housing. Moreover, the chip component entered into the outer housing via the communicating path cannot mesh with the chip component in the outer housing, resulting in decreased damage to chip components.

A component feeder may preferably further comprise an outer storage housing disposed above the inner housing and a supplying path inclined downward from the outer storage housing to the inner housing for supplying chip components from the outer storage housing to the inner housing. In this case, since chip components are aligned after being transferred in two cascaded stages, from the outer storage housing to the inner housing and in turn to the outer housing, even when a large number of chip components are supplied into the outer storage housing, agitating time of chip components can be reduced, and aligning efficiency can be increased. Since the chip component slides down by its own weight on the supplying path, external forces such as agitation forces are not exerted on the chip components in the path between the outer storage housing and the inner housing, resulting in reduced damage to the chip components.

A component feeder may preferably further comprise a bulk case, as means for supplying chip components into the outer storage housing, disposed in a component-supplying inlet of the outer storage housing, formed at the top thereof, for accommodating a predetermined number of chip components, wherein the bulk case having an aperture thereof directed downward is detachable. In this case, the chip components in the bulk case can be fed to the outer storage housing by gravity so that the feeding operation can be automated.

The aligning and discharging section formed on the inner surface of the feeder body forming the outer housing may preferably comprise an aligning groove for aligning chip components in a predetermined direction so as to slide the chip components downward, a gate formed at a lower end of the aligning groove for therethrough passing chip components sliding along the aligning groove in a predetermined orientation one at a time, and a discharge path connected to a lower portion of the gate, wherein the rotary drum may preferably be provided with a lug member for urging chip components standing at the gate in an abnormal orientation toward the opposite direction to that of discharging so as to undo blocking. In this case, the chip components are aligned simultaneously in a predetermined direction when the chip components are dropped into the aligning groove. For example, when a chip component is of a rectangular shape having a length larger than a height and a width thereof, the width of the aligning groove is established to be larger than the width and height of the chip component and to be smaller than the length thereof as well, so that the chip component can be longitudinally aligned in the aligning groove. The chip components dropped into the aligning groove slide down by gravity to the gate. At the gate, the chip components in a normal orientation (a sideways lying posture, for example) can pass therethrough as they are to be discharged to the discharge path, while the chip components in an abnormal orientation (a standing orientation, for example) are blocked by each other at the gate. Then the lug member of the rotary drum urges the chip component stopping at the gate toward the opposite direction to that of discharging so as to remove the chip component from the gate or to push the chip component down to the normal orientation. This results in undoing the blockage so that subsequent chip components may be discharged from the gate.

DESCRIPTION OF THE PREFERRED EMBODIMENTS

FIGS. 1 to 5 show a component feeder according to an embodiment of the present invention.

Figure 1:
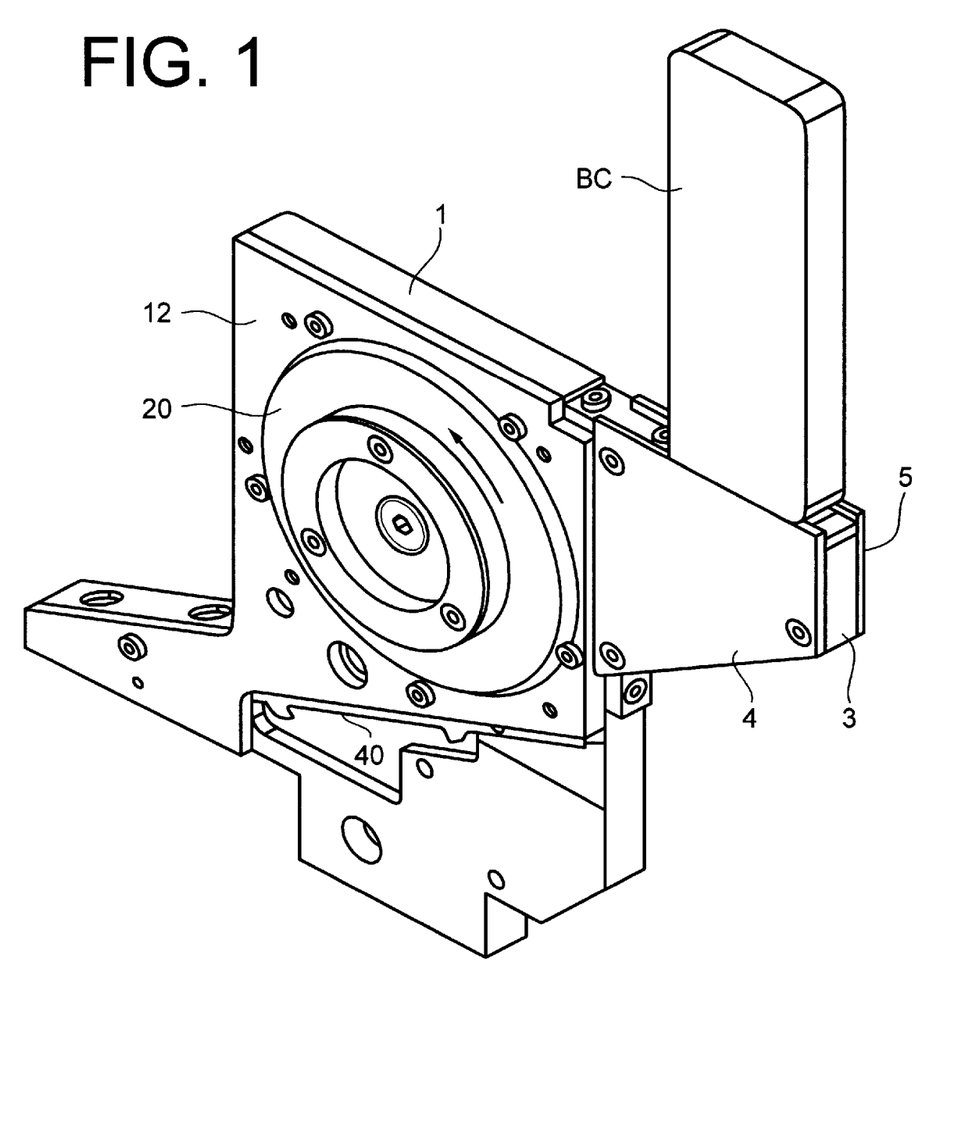
FIG. 1 is an overall schematic view of a component feeder according to an embodiment of the present invention.
Figure 2:
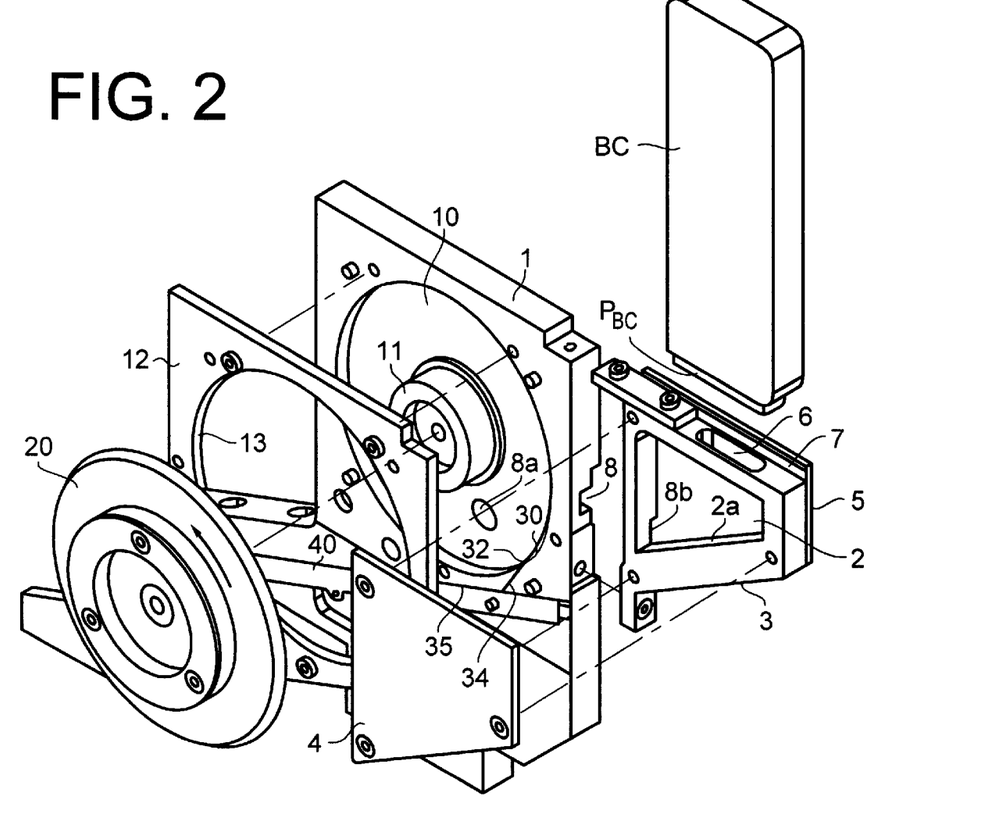
FIG. 2 is an assembly view of the component feeder shown in FIG. 1 viewed from the front side.
Figure 3:
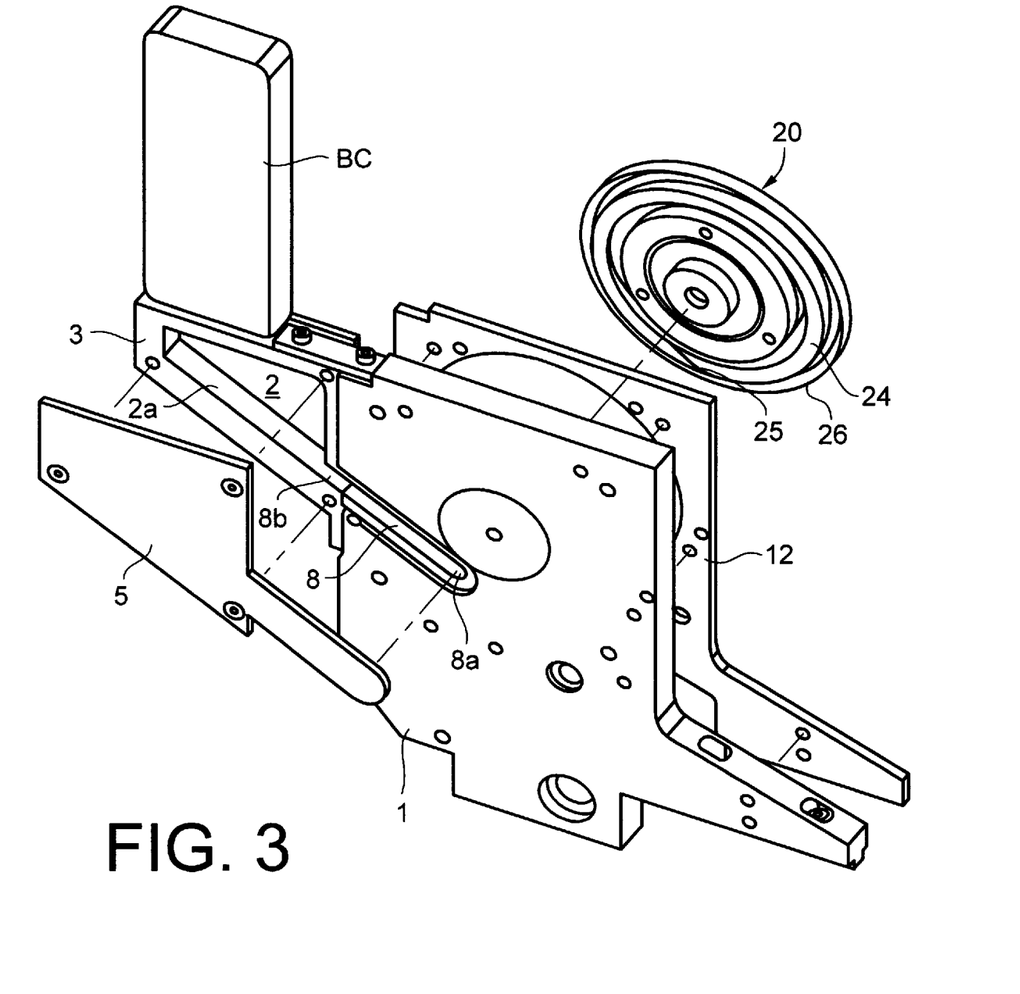
FIG. 3 is an assembly view of the component feeder shown in FIG. 1 viewed from the backside.

FIG. 1 is an overall view of the component feeder while FIG. 2 is an assembly view of the component feeder viewed from the front side and FIG. 3 is an assembly view of the component feeder viewed from the backside.

Figure 4:
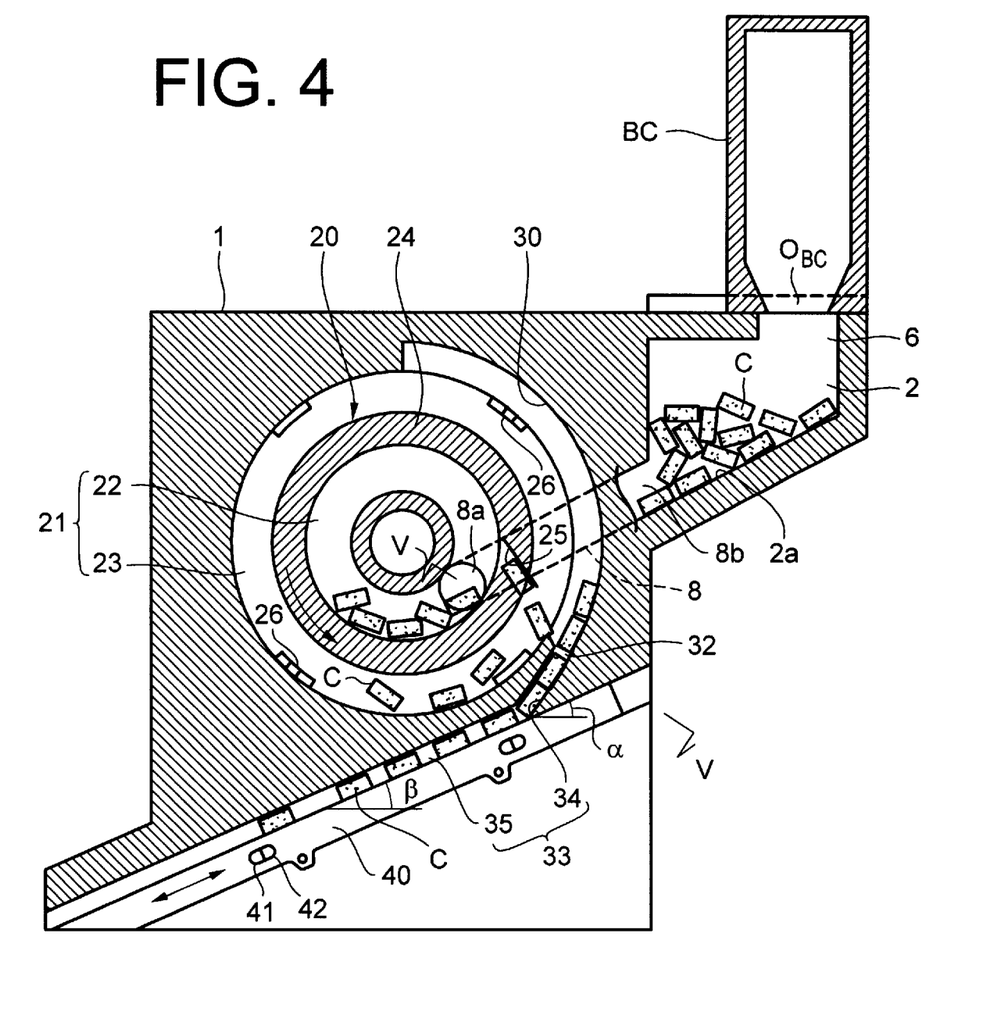
FIG. 4 is a longitudinal sectional view of the component feeder shown in FIG. 1.
Figure 5:
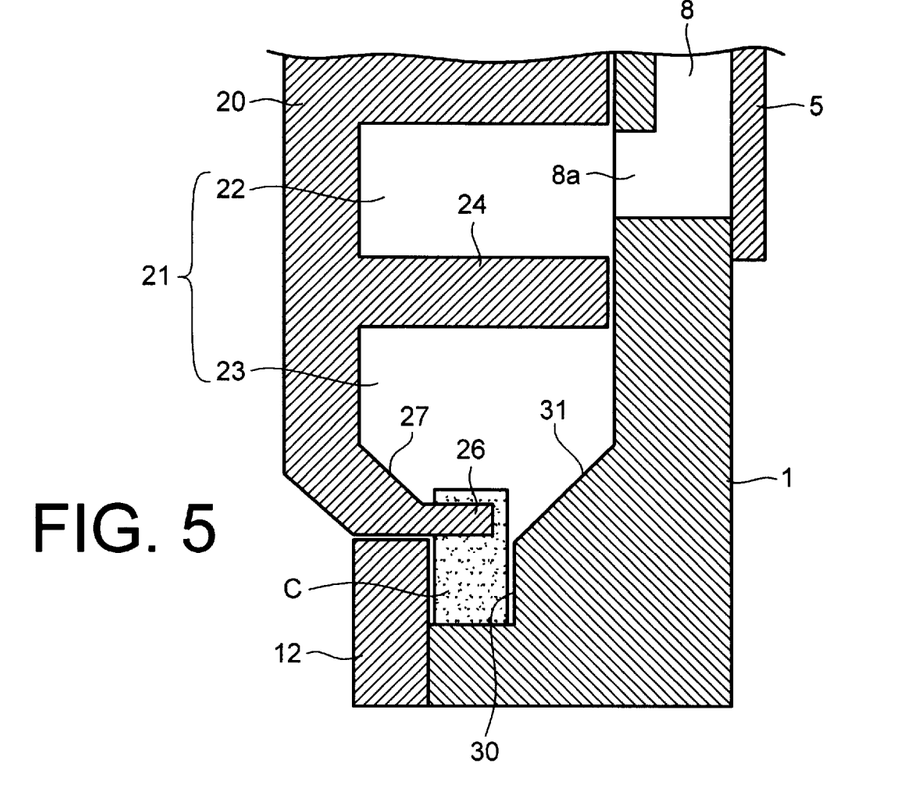
FIG. 5 is an enlarged sectional view at the line V—V of FIG. 4.
Figure 6:
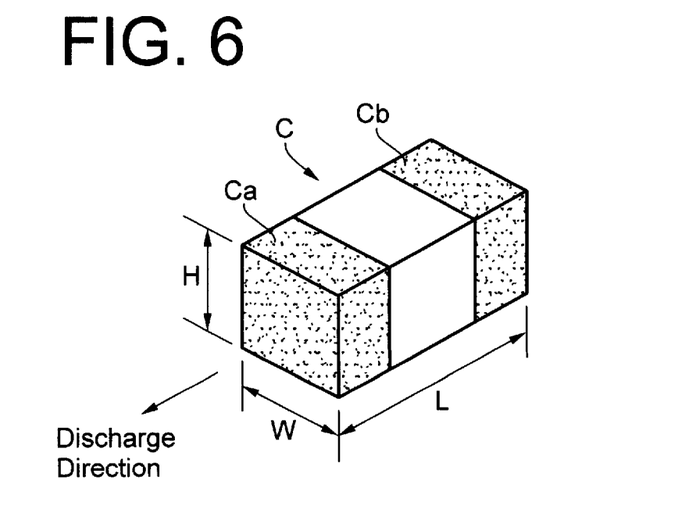
FIG. 6 is a schematic view of an example of chip components.
Figure 7:
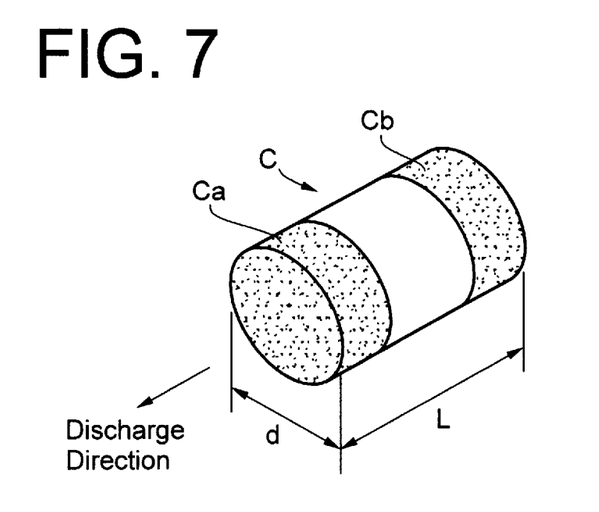
FIG. 7 is a schematic view of another example of chip components.
Figure 8A:
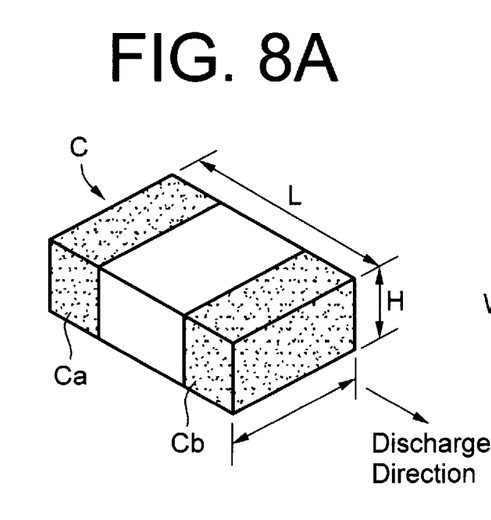
FIGS. 8A and 8B are schematic views of other examples of chip components.
Figure 8B:
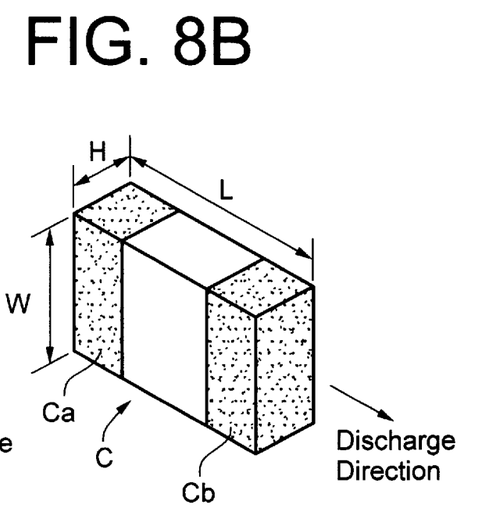

Although a rectangular-shaped chip component "C" which has a height "H", a width "W", and a length "L" ("H"="W", "L">"H", "L">"W") is used in this embodiment, as shown in FIG. 6, a cylinder-shaped chip component "C" having a diameter "d" and a length "L" ("d"="W", "H", "L">"d"), as shown in FIG. 7, and a rectangular-shaped chip component "C" having a difference between a width "W" and a height "H" ("L">"W">"H"), as shown in FIGS. 8A and 8B, may be used. In addition, "Ca" and "Cb" indicate terminals disposed in both ends of the chip component "C" in a longitudinal direction thereof. In FIGS. 4 and 5, the chip component "C" is illustrated enlarged in order to facilitate an understanding.

A component-feeder body comprises a fixed drum 1, a frame 3, front and backside covers 4 and 5, and a front surface cover 12, as will be described. The fixed drum 1 is a hard-plate member disposed vertically on which an outside storage housing 2 is formed in one side thereof. The outside storage housing 2 comprises a frame 3, a front cover 4, and a backside cover 5, on which a component supplying inlet 6 is disposed. On the component-supplying inlet 6, a bulk case "BC" for accommodating a predetermined number of chip components "C" is detachably disposed with an opening portion $O_{BC}$ thereof directed downward. That is, a concave-groove portion 7 is formed between topsides of front and backside covers 4 and 5, and the bottom end of the bulk case "BC" is engaged with the concave-groove portion 7 by laterally sliding the bulk case "BC", enabling the bulk case "BC" to be detachable. In the state of the bulk case "BC" equipped with the topside of the outside storage housing 2, by opening a shutter (not shown) equipped with the bulk case "BC", chip components "C" in the bulk case "BC" are supplied into the outside storage housing 2. When the bulk case "BC" is equipped with the topside of the outside storage housing 2 in this manner, the volume of the outside storage housing 2 can be substantially increased.

The bottom surface 2a of the outside storage housing 2 is formed to be inclined, and in the lowest portion thereof is formed an inlet 8b of a supplying path 8 for supplying the chip component "C" to an inner housing 22 of a component storage housing 21, which will be described, from the outside storage housing 2. The supplying path 8 is inclined so that the chip component "C" can slide down by its own weight.

In the front-side center portion of the fixed drum 1, a circular-shaped concave portion 10 is formed, in which an annular rib 11 for rotatably supporting the rotary drum 20 thereon is protrudingly formed in the center thereof. The rotary drum 20 is driven by a driving apparatus (not shown) in the direction indicated by the arrow. The drive system may be either a continuous or an intermittent one. On the front-side of the fixed drum 1 is secured the front surface cover 12 having an aperture 13 corresponding to the concave portion 10 thereto, while the outer periphery of the rotary drum 20 is rotatably fitted into the aperture 13 of the front surface cover 12. As shown in FIGS. 4 and 5, the component storage housing 21 is formed between the fixed drum 1 and the rotary drum 20. The component storage housing 21 is divided into an inner housing 22 and an outer housing 23 by a circumferential wall 24 formed in the rotary drum 20. In the circumferential wall 24 is formed a communicating path 25 through which a predetermined number of chip components "C" are transferred corresponding to the rotation of the rotary drum 20 in the direction of the arrow. Since the communicating path 25 is inclined toward the inner diameter relative to the rotational direction of the rotary drum 20, the chip components "C" in the inner housing 22 are scooped up thereby corresponding to the rotation of the rotary drum 20 to be dropped into the outer housing 23. The chip component "C" dropped into the outer housing 23 cannot mesh with the chip component "C" in the outer housing 23, resulting in decreased damage to chip components "C". Although only one communicating path 25 is formed in this embodiment, a plurality of communicating paths 25 may be formed.

An aperture 8a to the inner housing 22 which is an outlet of the supplying path 8 is formed in the vertically intermediate position of the inner housing 22, preferably slightly lower than the vertically center position of the inner housing 22, resulting in preventing more than the required number of chip components "C" from entering into the inner housing 22. In addition, the volume of the inner housing 22 is smaller than that of the outside storage housing 2.

An aligning discharge portion for discharging chip components "C" aligning in one line is formed in the outer housing 23. In this embodiment, the aligning discharge portion comprises an aligning groove 30, a gate 32, a discharge path 33, and lug members 26.

As shown in FIGS. 4 and 5, the aligning groove 30 is a semi-circular groove formed between the inner periphery surface of the concave portion 10 in the fixed drum 1 and the inside surface of the aperture 13 in the front surface cover 12. The groove 30 has a width wider than the width "W" of the chip component "C" by a predetermined clearance, and a depth deeper than the height "H" of the chip component "C" by a predetermined clearance. On the above-mentioned inner periphery surface of the concave portion 10, a tapered guide surface 31 is formed in the direction of the cross-sectional surface. This guide surface 31 is inclined downward to the aligning groove 30 for guiding the chip component "C" toward the aligning groove 30. On the inner surface of the rotary drum 20, a guide surface 27 is formed in an opposed relation to the guide surface 31 of the fixed drum 1. The guide surfaces 27 and 31 are not limited to a tapered shape, and they may be any shape allowing them to slide the chip component "C" into the aligning groove 30.

At the bottom end of the aligning groove 30, between the fixed drum 1 and the front surface cover 12 is formed a gate 32 through which the chip component "C" can pass one by one longitudinally and sideways. That is, the gate 32 has a height and a width which are slightly larger than "H" and "W", and are smaller than "L". The width of the gate 32 is equal to that of the aligning groove 30. Below the gate 32, the discharge path 33 is formed between the fixed drum 1 and the front surface cover 12.

On the side edge of the outer periphery of the above-mentioned rotary drum 20, a plurality of lug members 26 are protrudingly formed in uniformly spaced relation to each other in the peripheral direction. Although four lug members 26 are illustrated in FIG. 4, a greater number thereof is actually formed. The lug members 26 are rotated passing through and over the gate 32 and the aligning groove 30, having functions of undoing blockage of the chip components "C" at the gate 32 and of feeding the chip component "C" in the outer housing 23 into the aligning groove 30. That is, when the chip component "C" slides down along the aligning groove 30 in a standing orientation, it strikes the gate 32 and obstructs subsequent chip components "C" from passing by stopping there. When the rotary drum 20 rotates in the direction of the arrow, as shown in FIG. 5, the lug member 26 urges the chip component "C" stopping at the gate 32 in the opposite direction to the discharge path 33 to push the chip component "C" down to the horizontal position or to push the chip component "C" back toward the aligning groove 30. This results in undoing the blockage at the gate 32.

The discharge path 33 comprises a first path 34 formed in the roughly tangential direction to the circle of the aligning groove 30 and a second path 35 intersecting with the first path 34. A angle of inclination α of the first path 34 is larger than a angle of inclination β of the second path 35, and it is preferable that it be selected to be ≧35° to ensure the chip component "C" sliding down in the first path 34, while the inclination β of the second path 35 may be below 35°.

On the bottom of the second path 35, a blade 40 formed of a thin metallic plate is longitudinally and moveably positioned with long holes 41 formed in the front and rear thereon. The blade 40 can reciprocate parallel to the second path 35 by inserting pins 42 protrudingly formed in the fixed drum 1 into the long holes 41. The stroke of the blade 40 is established to be smaller than the length of the chip component "C". The chip components "C" in the second path 35 can slide down smoothly, even if the angle of inclination β is small, by reciprocating the blade 40 back and forth by driving means (not shown) so as to free the friction between the chip component "C" and the blade 40. In addition, the bottom end of the second path 35 communicates with a picking out unit (not shown).

The operation of the component feeder configured as above will now be described.

When chip components "C" are supplied into the outside storage housing 2 by attaching the bulk case "BC" to the component supplying inlet 6 at first, a predetermined number of the chip components "C" are fed at one time to the inner housing 22 by the inclinations of the bottom surface 2a of the outside storage housing 2 and the supplying path 8. The chip components "C" entered into the inner housing 22 are gradually transferred to the outer housing 23 via the communicating path 25 in accordance with the rotation of the rotary drum 20. The number of the chip components "C" in the outer housing 23 can be appropriately limited to maintain high degree of alignment and discharging efficiency by reducing the number of components supplied to the outer housing 23 from the inner housing 22 per unit time, which are determined by the number and the sizes of the communicating paths 25 and the rotational speed of the rotary drum 20, to be smaller than the number of components discharged from the outer housing 23 per unit time via the gate 32.

The chip components "C" entered into the outer housing 23 are urged by the lug member 26 toward the aligning groove 30 to be aligned in a predetermined direction by dropping into the aligning groove 30. Then the chip components "C" slide downward along the aligning groove 30 to the discharge path 33 via the gate 32. Although the chip component "C" standing up in the aligning groove 30 stops at the gate 32, since the lug member passes over the gate 32 periodically in the opposite direction to that of discharge, the chip component "C" stopping at the gate 32 is pushed down to the horizontal orientation. Accordingly, the blockage is immediately undone, preventing decrease in discharge efficiency. Moreover, since the number of the chip components "C" in the outer housing 23 is small, entanglements are not generated in the outer housing 23, increasing alignment efficiency, and because the chip components "C" are discharged to the discharge path 33 without being agitated for a long time, the chip component "C" will not be significantly damaged.

The chip components "C" entered into the discharge path 33 slide down on the first path 34 having a large inclination angle α toward the second path 35. Although as the angle of inclination β of the second path 35 is comparatively small, the chip components "C" may be possibly left undischarged due to friction of the blade 40, those chip components "C" can slide down smoothly by the longitudinal reciprocating movement of the blade 40.

In addition, since the angle of inclination β of the second path 35 is small, when the second path 35 is joined to the horizontal picking up unit, an intersecting angle between the second path 35 and the picking up unit can be established to be small so as to smoothly transfer the chip components "C" from the second path 35 to the picking up unit. At the picking up unit, the chip component "C" is picked up one by one by a picking up apparatus such as a chip mounter.

In the above-described embodiment, in the aligning groove 30 disposed in the inner periphery of the fixed drum 1, selection of the chip components "C" in the height and width directions ("H" and "W" directions) is performed, while by the gate 32 and the lug member 26, selection thereof in the length direction ("L" direction) is performed, resulting in highly increased efficiency of alignment and discharge compared with conventional bulk feeders. Since the discharging rate of the chip components "C" is scarcely affected by the rotation speed of the rotary drum 20, the chip component "C" will not be significantly damaged and by slowly rotating the rotary drum 20, the apparatus will be quiet.

The component feeder according to the present invention is not certainly limited to the above-described embodied structure.

In the above-described embodiment, the aligning and discharging section is formed of the circular-shaped aligning groove 30, the gate 32, the discharge path 33, and the lug members 26, however the invention is not limited to this structure. For example, another aligning and discharging section may be formed by forming another circumferential wall in the outer periphery of the circumferential wall 24 and a communicating path in this circumferential wall which is equivalent of the communicating path 25. In this case, the gate inlet and lug members are not necessary.

In the above-described embodiment, the discharge path 33 is formed of the first path 34 having a large angle of inclination α, and the second path 35 having the blade 40 and a small angle of inclination β, however it may be formed of any one of these paths only.

In the above-described embodiment, the bulk case "BC" is detachably formed on the top of the outside storage housing 2, however the chip component "C" may be directly supplied into the outside storage housing 2 without using the bulk case "BC".

In addition, the outside storage housing 2 is not compulsory in the present invention and the chip component "C" may be directly supplied into the inner housing 22, for example.

As will be understood from the above description, in accordance with the present invention, since a predetermined number of chip components in the inner housing is fed at a time to the outer housing via the communicating path in accordance with the rotation of the rotary drum, the number of chip components in the outer housing is to be comparatively small, resulting in reduction of entanglement generation and increased alignment and discharge efficiency. Since agitating time per chip component can be reduced, a rate of damage to components can be reduced.

What is claimed is:

1. A component feeder comprising:
    a feeder body;
    a rotary drum rotating relative to said feeder body about a horizontal axis; and
    a component storage housing formed between said feeder body and said rotary drum for storing chip components, wherein said rotary drum is provided with a circumferential wall dividing said component storage housing into an inner housing and an outer housing, the circumferential wall being provided with a communicating path for transferring a predetermined number of chip components from the inner housing to the outer housing in accordance with the rotation of said rotary drum, the outer housing being provided with an aligning and discharging section for aligning chip components in a line so as to be discharged.

2. A component feeder according to claim 1, wherein the communicating path is inclined toward the inner diameter of said rotary drum relative to the rotational direction of said rotary drum.

3. A component feeder according to claim 1, further comprising:
    an outer storage housing disposed above the inner housing; and
    a supplying path inclined downward from said outer storage housing to the inner housing for supplying chip components from said outer storage housing to the inner housing.

4. A component feeder according to claim 1, wherein the aligning and discharging section is formed on an inner surface of said feeder body forming the outer housing, comprising an aligning groove for aligning chip components in a predetermined direction so as to slide the chip components downward, a gate formed at a lower end of the aligning groove for therethrough passing chip components sliding along the aligning groove in a predetermined posture one by one, and a discharge path joint to a lower portion of the gate, and wherein said rotary drum is provided with a lug member for urging chip components standing at the gate in an abnormal orientation toward the opposite direction to that of discharging so as to undo blocking.

5. A component feeder according to claim 3, further comprising a bulk case disposed in a component-supplying inlet of said outer storage housing, formed at the top thereof, for accommodating a predetermined number of chip components, wherein said bulk case having an aperture directed downward is detachable.

6. A component feeder according to claim 2, further comprising:
    an outer storage housing disposed above the inner housing; and
    a supplying path inclined downward from said outer storage housing to the inner housing for supplying chip components from said outer storage housing to the inner housing.

7. A component feeder according to claim 2, wherein the aligning and discharging section is formed on an inner surface of said feeder body forming the outer housing, comprising an aligning groove for aligning chip components in a predetermined direction so as to slide the chip components downward, a gate formed at a lower end of the aligning groove for therethrough passing chip components sliding along the aligning groove in a predetermined posture one by one, and a discharge path joint to a lower portion of the gate, and wherein said rotary drum is provided with a lug member for urging chip components standing at the gate in an abnormal orientation toward the opposite direction to that of discharging so as to undo blocking.

8. A component feeder according to claim 3, wherein the aligning and discharging section is formed on an inner surface of said feeder body forming the outer housing, comprising an aligning groove for aligning chip components in a predetermined direction so as to slide the chip components downward, a gate formed at a lower end of the aligning groove for therethrough passing chip components sliding along the aligning groove in a predetermined posture one by one, and a discharge path joint to a lower portion of the gate, and wherein said rotary drum is provided with a lug member for urging chip components standing at the gate in an abnormal orientation toward the opposite direction to that of discharging so as to undo blocking.

9. A component feeder according to claim 4, wherein the aligning and discharging section is formed on an inner surface of said feeder body forming the outer housing, comprising an aligning groove for aligning chip components in a predetermined direction so as to slide the chip components downward, a gate formed at a lower end of the aligning groove for therethrough passing chip components sliding along the aligning groove in a predetermined posture one by one, and a discharge path joint to a lower portion of the gate, and wherein said rotary drum is provided with a lug member for urging chip components standing at the gate in an abnormal orientation toward the opposite direction to that of discharging so as to undo blocking.

* * * * *